(12) United States Patent
Nakamura

(10) Patent No.: US 11,978,645 B2
(45) Date of Patent: May 7, 2024

(54) LASER PROCESSING APPARATUS

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 890 days.

(21) Appl. No.: 16/941,013

(22) Filed: Jul. 28, 2020

(65) Prior Publication Data

US 2021/0035826 A1 Feb. 4, 2021

(30) Foreign Application Priority Data

Aug. 2, 2019 (JP) ................................. 2019-142863

(51) Int. Cl.
| | |
|---|---|
| *H01L 21/67* | (2006.01) |
| *B23K 26/03* | (2006.01) |
| *B23K 26/53* | (2014.01) |
| *G06T 7/00* | (2017.01) |
| *G08B 21/18* | (2006.01) |
| *H01L 21/683* | (2006.01) |
| *B23K 103/00* | (2006.01) |
| *H01L 21/268* | (2006.01) |
| *H01L 21/78* | (2006.01) |

(52) U.S. Cl.
CPC ...... *H01L 21/67092* (2013.01); *B23K 26/032* (2013.01); *B23K 26/53* (2015.10); *G06T 7/001* (2013.01); *G08B 21/182* (2013.01); *H01L 21/67115* (2013.01); *H01L 21/6836* (2013.01); *B23K 2103/56* (2018.08); *G06T 2207/30148* (2013.01); *H01L 21/268* (2013.01); *H01L 21/78* (2013.01); *H01L 2221/68327* (2013.01)

(58) Field of Classification Search
CPC .... H01L 21/67253; B23K 26/53; G06T 7/001
See application file for complete search history.

(56) References Cited

U.S. PATENT DOCUMENTS

| | | | |
|---|---|---|---|
| 7,709,767 B2 * | 5/2010 | Sakamoto | B23K 26/38 |
| | | | 219/121.72 |
| 2006/0119691 A1 * | 6/2006 | Shigematsu | H01L 21/67253 |
| | | | 347/131 |

(Continued)

FOREIGN PATENT DOCUMENTS

JP 2002192370 A 7/2002

*Primary Examiner* — Andrew D Graham
(74) *Attorney, Agent, or Firm* — GREER BURNS & CRAIN, LTD.

(57) ABSTRACT

A control unit of a laser processing apparatus includes: a reference image storage section that images streets before formation of modified layers by an imaging unit and stores the captured image as a reference image; a calculation section that compares the reference image stored in the reference image storage section with an image of a wafer held by a chuck table that is captured by the imaging unit, and calculates the degree of agreement of the two images; and a decision section that decides whether the wafer is an unprocessed wafer not formed with the modified layers in the case where the degree of agreement calculated by the calculation section is more than a first predetermined value, and decides whether the wafer is a processed wafer formed with the modified layers in the case where the degree of agreement is equal to or less than a second predetermined value.

4 Claims, 5 Drawing Sheets

(56) References Cited

U.S. PATENT DOCUMENTS

| | | | |
|---|---|---|---|
| 2006/0124615 A1* | 6/2006 | Azuma | B23K 26/04 219/121.67 |
| 2006/0243710 A1* | 11/2006 | Azuma | H01L 21/67092 219/121.67 |
| 2008/0170243 A1* | 7/2008 | Nomaru | H01L 21/67253 356/634 |
| 2009/0127233 A1* | 5/2009 | Asano | B23K 26/032 219/121.7 |
| 2010/0012633 A1* | 1/2010 | Atsumi | C03B 33/091 219/121.72 |
| 2010/0074515 A1* | 3/2010 | Zhao | G01N 25/72 382/149 |
| 2010/0184271 A1* | 7/2010 | Sugiura | C03B 33/0222 257/E21.347 |
| 2010/0188486 A1* | 7/2010 | Amanullah | G01N 21/9501 348/48 |
| 2010/0200550 A1* | 8/2010 | Kumagai | B28D 5/0011 219/121.72 |
| 2010/0301521 A1* | 12/2010 | Uchiyama | B23K 26/38 264/400 |
| 2010/0311313 A1* | 12/2010 | Uchiyama | B23K 26/0869 451/41 |
| 2011/0000897 A1* | 1/2011 | Nakano | H01L 23/544 219/121.72 |
| 2011/0001220 A1* | 1/2011 | Sugiura | B23K 26/40 219/121.72 |
| 2011/0069313 A1* | 3/2011 | Sakai | G06T 7/001 356/369 |
| 2011/0274128 A1* | 11/2011 | Fukumitsu | B23K 26/0738 372/38.1 |
| 2013/0092669 A1* | 4/2013 | Morikazu | B23K 26/402 219/121.67 |
| 2015/0168848 A1* | 6/2015 | Tanaka | G03F 7/70483 438/16 |
| 2015/0343562 A1* | 12/2015 | Hirose | B23K 26/0648 425/135 |
| 2016/0189989 A1* | 6/2016 | Hanajima | H01L 21/67092 83/520 |
| 2017/0047237 A1* | 2/2017 | Kobata | H01L 21/67092 |
| 2017/0151632 A1* | 6/2017 | Wang | B23K 26/0006 |
| 2017/0213756 A1* | 7/2017 | Yoshida | H01L 21/78 |
| 2017/0236738 A1* | 8/2017 | Van Lieshout | B23K 26/364 425/174 |
| 2017/0243738 A1* | 8/2017 | Noda | G03F 7/2028 |
| 2017/0263473 A1* | 9/2017 | Maeda | B23K 26/53 |
| 2017/0368636 A1* | 12/2017 | Ryo | H01L 22/12 |
| 2017/0370856 A1* | 12/2017 | Takeda | G01N 21/3563 |
| 2018/0076060 A1* | 3/2018 | Oh | H01L 21/67288 |
| 2018/0144983 A1* | 5/2018 | Shigematsu | H01L 21/02076 |
| 2018/0214986 A1* | 8/2018 | Ban | H01L 21/67288 |
| 2019/0043743 A1* | 2/2019 | Maeda | B23K 26/364 |
| 2019/0067108 A1* | 2/2019 | Tanaka | B28D 5/0052 |
| 2019/0076986 A1* | 3/2019 | Shigematsu | H04N 5/33 |
| 2019/0080943 A1* | 3/2019 | Kim | H01L 21/67253 |
| 2019/0164833 A1* | 5/2019 | Kirihara | H01L 21/67253 |
| 2019/0214318 A1* | 7/2019 | Maslow | H01L 22/20 |
| 2020/0202504 A1* | 6/2020 | Shchemelinin | G06T 5/003 |
| 2021/0005476 A1* | 1/2021 | Shionoya | B23K 26/048 |

\* cited by examiner

FIG.4A
FIG.4B
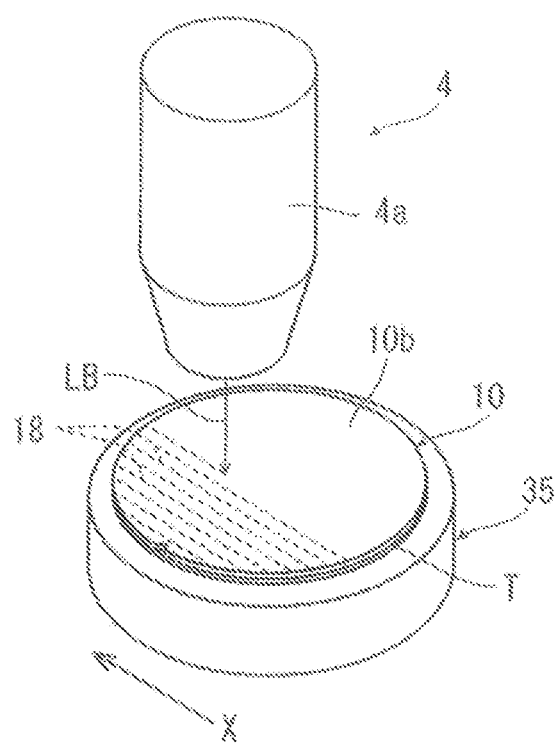
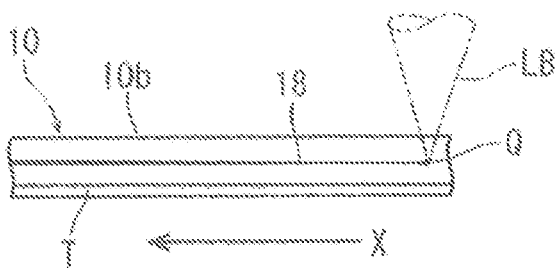

LASER PROCESSING APPARATUS

BACKGROUND OF THE INVENTION

Field of the Invention

The present invention relates to a laser processing apparatus that applies laser processing to a wafer formed on a front surface thereof with a plurality of devices in the state of being partitioned by a plurality of intersecting division lines (streets).

Description of the Related Art

A wafer formed on its front surface with a plurality of devices such as integrated circuits (ICs) and large-scale integrated circuits (LSIs) in the state of being partitioned by a plurality of intersecting streets is divided into individual device chips by a dicing apparatus or a laser processing apparatus, and the thus divided device chips are used for electric equipment such as mobile phones and personal computers.

The laser processing apparatus includes: a chuck table that holds the wafer; a laser beam applying unit that applies a laser beam of such a wavelength as to be transmitted through the wafer to the wafer held by the chuck table, with a focal point of the laser beam positioned inside the wafer along the streets, to form modified layers to be start points of division; a feeding mechanism that puts the chuck table and the laser beam applying unit into relative processing feed; an imaging unit that images the wafer; and a control unit, and the laser processing apparatus can divide the wafer with high accuracy (see, for example, Japanese Patent No. 3408805).

SUMMARY OF THE INVENTION

In the case where a laser beam is applied to a wafer with a focal point of the laser beam positioned inside the wafer along the streets to thereby form modified layers as described above, the presence of the modified layers cannot be easily confirmed by the naked eye, and it is impossible to determine whether or not the wafer has been processed. Therefore, there is a problem that notwithstanding the wafers accommodated in a cassette have been processed, the cassette may be set on a laser processing apparatus for some reason, and the processed wafer accommodated in the cassette may be subjected again to laser processing. If a laser beam is again applied to a processed wafer already formed with modified layers along streets, irregular reflection of the laser beam on the already formed modified layers would occur, to damage the devices, resulting in a considerable loss.

It is therefore an object of the present invention to provide a laser processing apparatus in which re-processing of an already processed wafer is prevented.

In accordance with an aspect of the present invention, there is provided a laser processing apparatus for subjecting a wafer to laser processing, the wafer being formed on a front surface thereof with a plurality of devices in a state of being partitioned by a plurality of intersecting streets, the laser processing apparatus including: a chuck table that holds the wafer; a laser beam applying unit that applies a laser beam of such a wavelength as to be transmitted through the wafer to the wafer held by the chuck table, with a focal point of the laser beam positioned inside the wafer along the streets, to form modified layers to be start points of division; a feeding mechanism that performs relative processing feed of the chuck table and the laser beam applying unit; an imaging unit that images the wafer in a manner of transmission through the wafer; and a control unit. The control unit includes: a reference image storage section that images the streets before formation of the modified layers by the imaging unit and stores an obtained image as a reference image; a calculation section that compares the reference image stored in the reference image storage section with an image of the wafer held by the chuck table, the image being captured by the imaging unit, and calculates the degree of agreement of the two images; and a decision section that decides that the wafer held by the chuck table is an unprocessed wafer not formed with the modified layers in the case where the degree of agreement calculated by the calculation section is more than a first predetermined value, and decides that the wafer held by the chuck table is a processed wafer formed with the modified layers in the case where the degree of agreement is equal to or less than a second predetermined value.

Preferably, the control unit issues an alarm signal in the case where the decision section decides that the wafer held by the chuck table has been processed, before the laser processing of forming the wafer with the modified layers by the laser beam applying unit is carried out. Preferably, the first predetermined value is set to be higher than the second predetermined value, and the control unit issues an alarm signal indicating that defective processing has been generated in the case where the decision section decides that the degree of agreement calculated by the calculation section is not above the first predetermined value and is not below the second predetermined value. Further, the first predetermined value and the second predetermined value may be the same value.

The control unit of the laser processing apparatus of the present invention includes the decision section that decides that the wafer held by the chuck table is an unprocessed wafer not yet formed with the modified layer in the case where the degree of agreement calculated by the calculation section is more than the first predetermined value, and decides that the wafer held by the chuck table is a processed wafer formed with the modified layers in the case where the degree of agreement is equal to or less than the second predetermined value. Therefore, re-processing of the processed wafer by the laser processing apparatus can be prevented, and a problem that irregular reflection of the laser beam on the previously formed modified layers would occur to damage the devices can be solved.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 4A is a perspective view depicting the manner of subjecting a wafer to laser processing, in the laser processing apparatus illustrated in FIG. 1;

FIG. 4B is a sectional view of the wafer after the laser processing is carried out.

DETAILED DESCRIPTION OF THE PREFERRED EMBODIMENT

Figure 1:
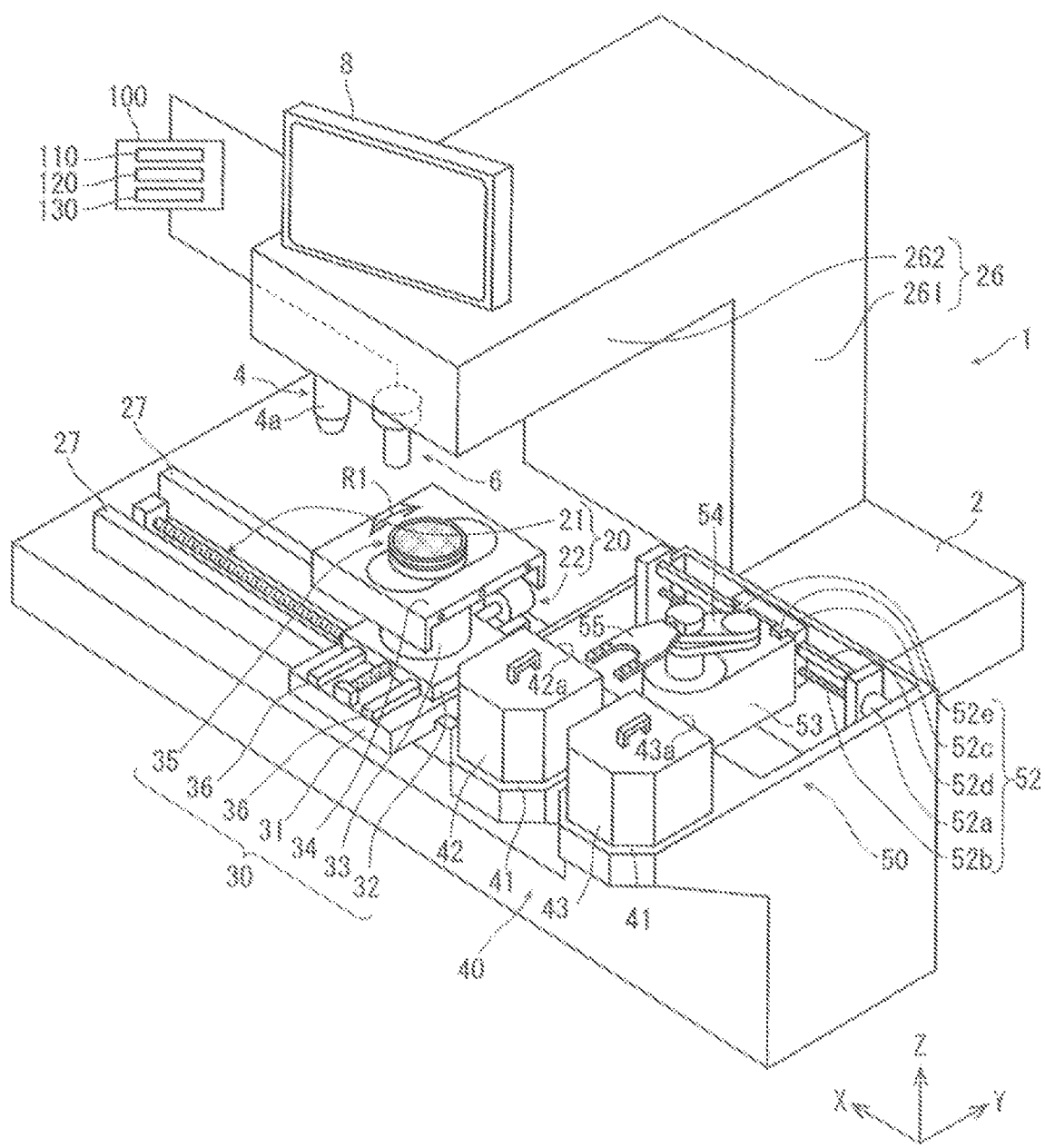
FIG. 1 is a general perspective view of a laser processing apparatus.

A laser processing apparatus according to an embodiment of the present invention will be described in detail below, referring to the attached drawings. FIG. 1 depicts a general perspective view of a laser processing apparatus 1 according to the present embodiment. The laser processing apparatus 1 includes: a laser beam applying unit 4 that is disposed on a base 2 and that functions as processing means for applying a laser beam to a wafer serving as a workpiece; a holding unit 30 that holds the wafer; an imaging unit 6 that images the wafer held by the holding unit 30; a feeding mechanism 20 that puts the laser beam applying unit 4 and the holding unit 30 into relative processing feed and relatively moves the imaging unit 6 and the holding unit 30; a frame body 26 that includes a vertical wall section 261 erected on the depth side on the base 2 and a horizontal wall section 262 extending in a horizontal direction from an upper end portion of the vertical wall section 261; a cassette mounting mechanism 40 and a conveying-in/out mechanism 50 disposed adjacently to the feeding mechanism 20 on the base 2; and a control unit 100 that controls each of operating sections of the laser processing apparatus 1.

An optical system (omitted from illustration) constituting the laser beam applying unit 4 is accommodated in the inside of the horizontal wall section 262 of the frame body 26. The laser beam applying unit 4 includes a laser oscillator, output control means, and the like which are not illustrated, and a light condenser 4a constituting a part of the laser beam applying unit 4 is disposed on the side of a lower surface of a tip portion of the horizontal wall section 262.

The imaging unit 6 is disposed at a position adjacent, in an X axis direction indicated by an arrow X in the figure, to the light condenser 4a of the laser beam applying unit 4. On the upper side of the horizontal wall section 262, there is disposed a display unit 8 that is connected to the control unit 100 and has a touch panel function of displaying processing conditions for the laser processing apparatus 1 and inputting the processing conditions by an operator.

The control unit 100 includes: a central processing unit (CPU) that includes a computer and performs arithmetic processing according to a control program; a read only memory (ROM) that stores the control program and the like; a random access memory (RAM) that is capable of reading and writing and is used for momentarily storing an image captured by the imaging unit 6, detection values detected, the results of arithmetic processing and the like; an input interface; and an output interface (illustration of details is omitted). The control unit 100 has functions of controlling each of operating sections of the laser processing apparatus 1, recording appropriate information including an image captured by the imaging unit 6, analyzing the image captured by the imaging unit 6, and deciding, for example, whether the wafer is not yet processed or has been processed. Note that while the control unit 100 is depicted outside the laser processing apparatus 1 in FIG. 1 for convenience of explanation, the control unit 100 in practice is accommodated in the inside of the laser processing apparatus 1.

As illustrated in FIG. 1, the holding unit 30 includes: a rectangular X axis direction movable plate 31 mounted on the base 2 movably in the X axis direction; a rectangular Y axis direction movable plate 32 mounted on the X axis direction movable plate 31 movably in a Y axis direction; a cylindrical support column 33 fixed on an upper surface of the Y axis direction movable plate 32; and a rectangular cover plate 34 fixed to an upper end of the support column 33. A chuck table 35 extending upward through a slot formed on the cover plate 34 is disposed at the cover plate 34. The chuck table 35 is configured to hold a circular wafer and to be rotatable in the direction indicated by an arrow R1 by rotational driving means (not illustrated) accommodated in the support column 33. An upper surface of the chuck table 35 constitutes a holding surface that is formed of a porous material having air permeability and that extends substantially horizontally. The chuck table 35 is connected to suction means (omitted from illustration) by a passage (not illustrated) passing through the inside of the support column 33.

The feeding mechanism 20 includes an X axis feeding mechanism 21, a Y axis feeding mechanism 22, and the above-mentioned rotational driving means (not illustrated) accommodated in the support column 33. The X axis feeding mechanism 21 converts a rotational motion of a motor (not illustrated) into a rectilinear motion through a ball screw, and transmits the rectilinear motion to the X axis direction movable plate 31, thereby advancing and retracting the X axis direction movable plate 31 in the X axis direction along guide rails 27 on the base 2. The Y axis feeding mechanism 21 also has a similar configuration, converts a rotational motion of a motor into a rectilinear motion through a ball screw, and transmits the rectilinear motion to the Y axis direction movable plate 32, thereby advancing and retracting the Y axis direction movable plate 32 in the Y axis direction along guide rails 36 on the X axis direction movable plate 31. Note that position sensors including an appropriate scale and appropriate reading means (both omitted from illustration) are disposed at the guide rails 27 on the base 2, the guide rails 36 on the X axis direction movable plate 31, and the chuck table 35, so that accurate positions of the chuck table 35 in the X axis direction, the Y axis direction, and a rotational direction can be detected. As a result, while detecting the positions of the chuck table 35, the feeding mechanism 20 is operated, so that the chuck table 35 can be moved relative to the imaging unit 6 and the light condenser 4a of the laser beam applying unit 4 and be positioned at a desired position.

The imaging unit 6 includes: a normal imaging element (charge-coupled device (CCD)) for imaging using visible rays; infrared ray applying means that applies infrared rays to the workpiece; an optical system that captures the infrared rays applied by the infrared ray applying means; and an imaging element (infrared CCD) that outputs an electrical signal corresponding to the infrared rays captured by the optical system. Since the imaging unit 6 includes the infrared ray applying means and the infrared CCD as above-mentioned, even in the case where a wafer of silicon or the like is imaged from the back side, the streets formed on the front surface side, the modified layers formed inside the wafer along the streets, a reference mark required when performing alignment, and the like can be imaged through the wafer. The imaging unit 6 configured in this way is used for alignment for registration between a laser application position by the light condenser 4a of the laser beam applying unit 4 and a to-be-processed region of the wafer.

The cassette mounting mechanism 40 in the present embodiment includes cassette mounting regions 41 in which to mount a first cassette 42 and a second cassette 43 for accommodating a plurality of wafers. The operator mounts the first cassette 42 and the second cassette 43 with unprocessed wafers accommodated therein on each of the cassette mounting regions 41, in the state of being aligned in a predetermined direction. When the wafers accommodated in the first cassette 42 and the second cassette 43 are processed and the processed wafers are accommodated in the first cassette 42 and the second cassette 43, the cassettes 42 and 43 are conveyed from the cassette mounting regions 41 to an appropriate apparatus in a latter step.

The conveying-in/out mechanism 50 is disposed in a region for facing an opening 42a of the first cassette 42 and an opening 43a of the second cassette 43. The conveying-in/out mechanism 50 includes a driving mechanism 52, an arm base 53, an arm mechanism 54 having a plurality of arm sections, and a robot hand 55 formed at a tip of the arm mechanism 54. The driving mechanism 52 converts a rotational motion of a motor 52a into a rectilinear motion through a ball screw 52b, transmits the rectilinear motion to a conveying-in/out movable plate 52c, and accurately positions the conveying-in/out movable plate 52c at a desired position in the X axis direction along a guide rail 52d arranged in the X axis direction. A pair of rails 52e and 52e are formed in the vertical direction, on a front surface of the conveying-in/out movable plate 52c, and the arm base 53 moved vertically along the rails 52e and 52e is supported. While detailed illustration is omitted, a motor and a driving mechanism that converts a rotational motion of the motor into a rectilinear motion through a ball screw and transmits the rectilinear motion to the arm base 53 are provided between the conveying-in/out movable plate 52c and the arm base 53, and the arm base 53 is accurately positioned at a desired position in a Z axis direction (vertical direction) indicated by an arrow Z along the pair of rails 52e and 52e.

A rotational driving mechanism (omitted from illustration) for driving the arm mechanism 54 is accommodated in the arm base 53, and, in cooperation with motors disposed at joint parts of the respective arm sections, the U-shaped robot hand 55 disposed at a tip part of the arm mechanism 54 can be positioned at a desired position. The robot hand 55 is formed with a plurality of suction holes, and a negative pressure is supplied to the suction holes through the arm base 53 and the arm mechanism 54. The wafers can be conveyed in and out through the opening 42a of the first cassette 42 and the opening 43a of the second cassette 43, and, by operations of the arm mechanism 54 and the robot hand 55, the desired wafer is suction held and is conveyed to a conveying-in/out position where the chuck table 35 is positioned in FIG. 1. The wafer conveyed to the chuck table 35 positioned at the conveying-in/out position is accurately mounted on the chuck table 35 at a determined angle and suction held on the chuck table 35. The wafer suction held by the chuck table 35 is rotated by a predetermined angle by rotational driving means (omitted from illustration) disposed in the support column 33, is then positioned beneath the imaging unit 6, and is imaged, and, further, an alignment step is carried out. After the alignment step is performed, the chuck table 35 is positioned beneath the light condenser 4a of the laser beam applying unit 4, and laser processing is conducted for forming modified layers inside the wafer.

After the laser processing is applied to the wafer by the laser beam applying unit 4, the chuck table 35 is again positioned at the conveying-in/out position illustrated in FIG. 1, the processed wafer is suction held by the robot hand 55 of the conveying-in/out mechanism 50 and is returned to either position of the first cassette 42 and the second cassette 43 where the wafer has been accommodated before the processing.

Figure 2:
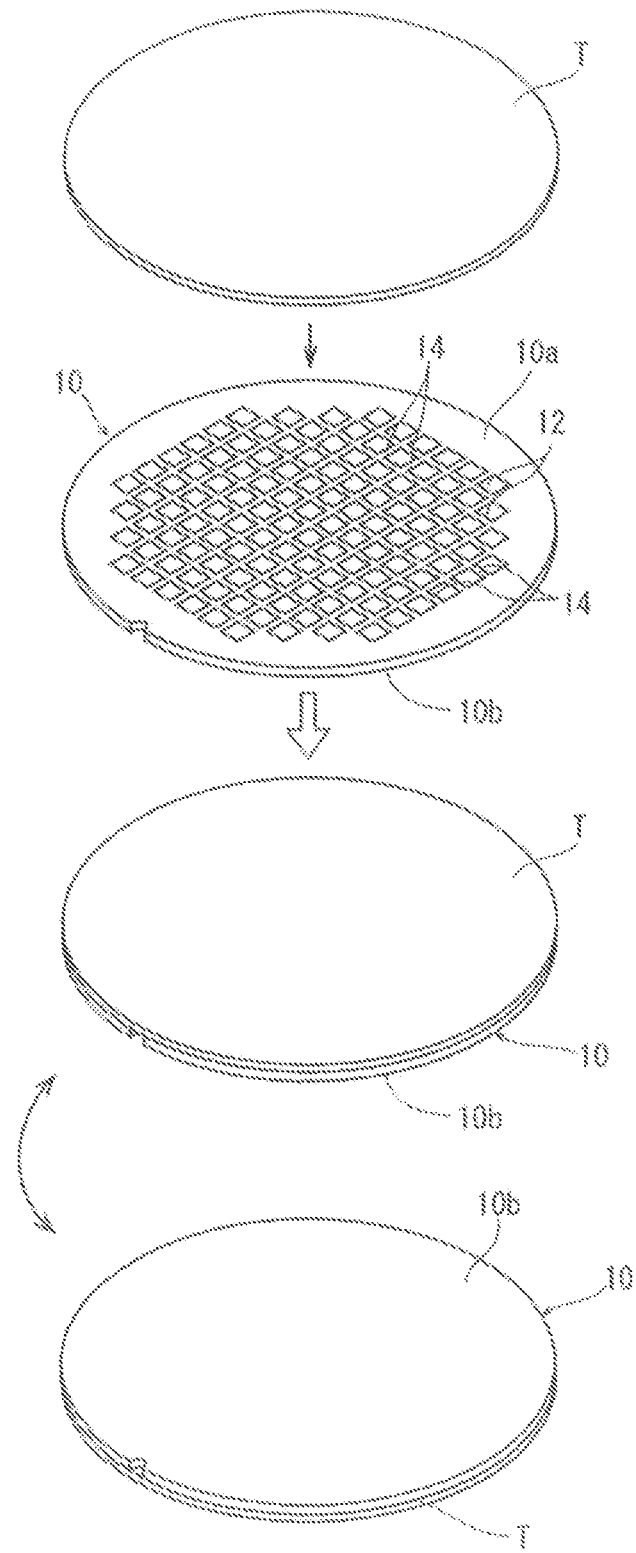
FIG. 2 is a perspective view of a wafer to be processed by the laser processing apparatus illustrated in FIG. 1 and a protective tape.

The laser processing apparatus 1 according to the present embodiment has the configuration generally described above, and its operation will be described below. FIG. 2 depicts a perspective view of a wafer 10 to be subjected to laser processing in the present embodiment. The wafer 10 is, for example, a silicon wafer formed on a front surface 10a thereof with a plurality of devices 12 in the state of being partitioned by a plurality of streets 14 formed in a grid pattern. A protective tape T formed in the same shape as the wafer 10 is adhered to, and united with, the front surface 10a of the wafer 10. A plurality of the wafers 10, each with the protective tape T adhered to the front surface 10a thereof, are inverted as depicted at the lowermost part of FIG. 2, into a state with the protective tape T directed to the lower side and with the back surface 10b thereof directed to the upper side, and are accommodated at predetermined intervals in the first cassette 42 or the second cassette 43.

When performing laser processing by the laser processing apparatus 1, the operator conveys the first cassette 42 and the second cassette 43 with a plurality of unprocessed wafers accommodated therein to the laser processing apparatus 1, and mounts the cassettes 42 and 43 on the cassette mounting regions 41.

After the first cassette 42 and the second cassette 43 are mounted on the cassette mounting regions 41, the operator sets processing conditions of the laser processing and the like on the laser processing apparatus 1, and instructs starting of the laser processing. After the starting of the laser processing is instructed, the driving mechanism 52, the arm base 53, the arm mechanism 54, and the robot hand 55 of the conveying-in/out mechanism 50 described above are operated, so that, for example, a predetermined wafer 10 is suction held and conveyed out of the first cassette 42. The wafer 10 conveyed out of the first cassette 42 is conveyed onto and mounted on the chuck table 35 positioned at the position (conveying-in/out position) illustrated in FIG. 1. Next, the suction means not illustrated is operated, so that the wafer 10 is suction held on the chuck table 35.

Figure 3:
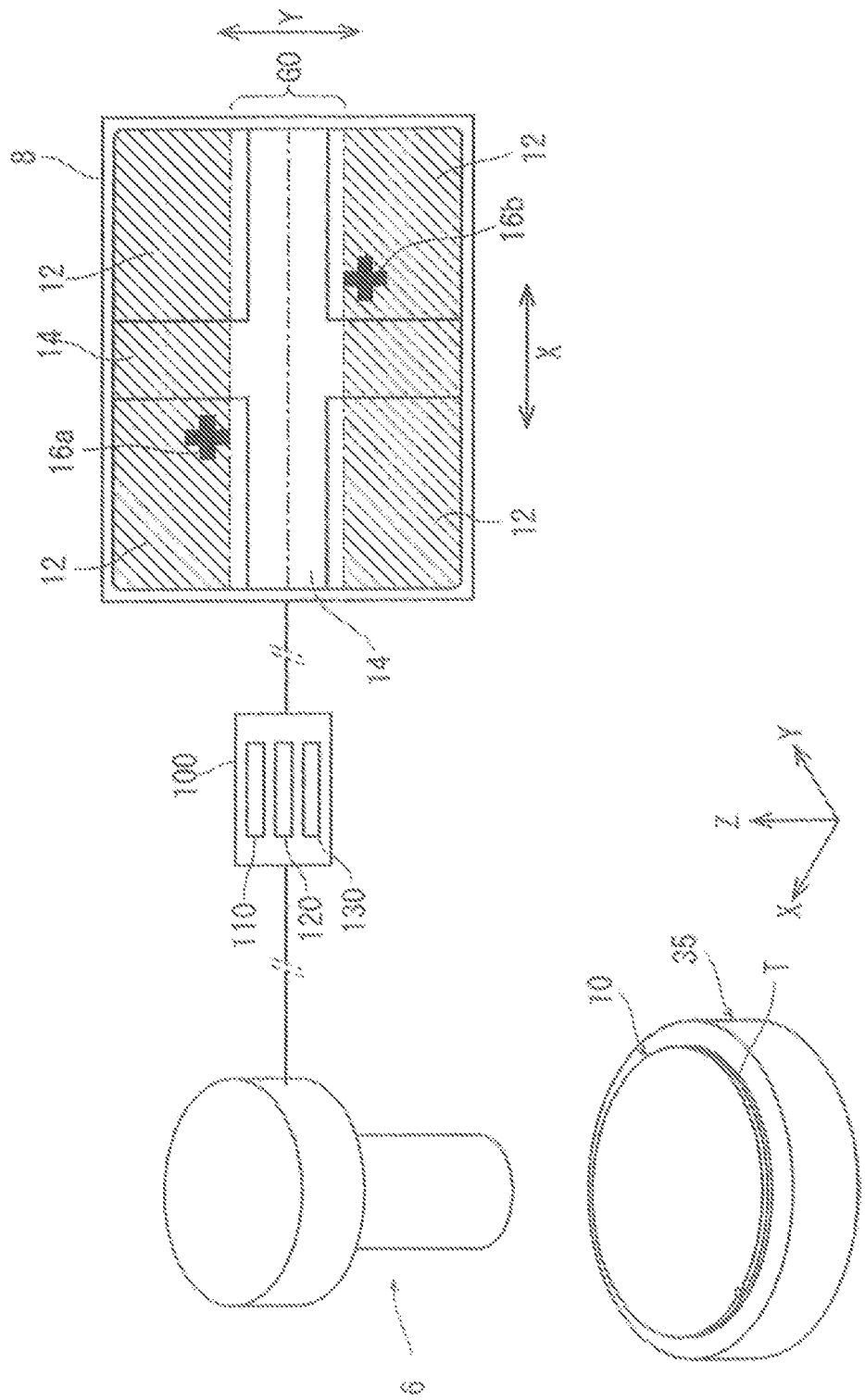
FIG. 3 is a perspective view depicting the manner of capturing a reference image and storing it, in the laser processing apparatus illustrated in FIG. 1.

After the wafer 10 is mounted and suction held on the chuck table 35, a reference image capturing step described below is conducted only at first in applying laser processing to a predetermined wafer 10. In performing the reference image capturing step, the feeding mechanism 20 is operated to move the chuck table 35, and, as depicted in FIG. 3, the wafer 10 suction held by the chuck table 35 is positioned beneath the imaging unit 6. After the wafer 10 is positioned beneath the imaging unit 6, a predetermined region is imaged and is displayed on the display unit 8 through the control unit 100. The predetermined region is determined with reference to predetermined marks 16a and 16b set in advance. It is preliminarily confirmed that the wafer imaged in FIG. 3 is unprocessed and is yet to be formed with modified layers.

After the predetermined region of the unprocessed wafer 10 is imaged as depicted on the display unit 8 in FIG. 3, only a central region including the street 14 extending in the X axis direction (left-right direction), with the marks 16a and 16b on both sides thereof, of the imaged region displayed on the display unit 8, is stored as a reference image G0 in a reference image storage section 110 set in the control unit 100. In addition, at the time of storing the reference image G0, an X coordinate and a Y coordinate of the chuck table 35 in this instance are also stored. Note that, since the imaging unit 6 is means for capturing an image by use of infrared rays as above-mentioned, the reference image G0 consists of two colors of black and white. For example, the reference image G0 is an image expressed in 256 gradations. By these operations, the reference image capturing step is completed.

After the reference image G0 is stored in the reference image storage section 110 of the control unit 100 as above-mentioned, an alignment step is conducted using the imaging unit 6. In performing the alignment step, the rotational driving mechanism (not illustrated) accommodated in the support column 33 is operated, so that the chuck table 35 with the wafer 10 held thereon is rotated, as required, so as to position the crystal orientation of the wafer 10 in a predetermined direction. By the alignment step, registration between the position where a laser beam LB is applied from the light condenser 4a of the laser beam applying unit 4 and the to-be-processed position (the street 14) of the wafer 10 is ensured. Note that the alignment step may be performed simultaneously with the above-mentioned reference image capturing step, and the reference image capturing step may be conducted in the course of performing the alignment step.

After the alignment step is conducted as above-mentioned, on the basis of position information obtained by the alignment step, a focal point Q of the laser beam applying unit 4 is positioned inside the wafer 10 along the street 14, as depicted in FIGS. 4A and 4B. Then, while performing processing feed of the chuck table 35 in the X axis direction by operating the above-mentioned X axis feeding mechanism 21, the laser beam LB is applied to form a modified layer 18 along the street 14. After the modified layer 18 is formed along a predetermined street 14, indexing feed of the wafer 10 in the Y axis direction (indexing feed direction) is conducted by operating the Y axis feeding mechanism 22, and application of the laser beam LB corresponding to the street 14 yet to be processed is performed to form a modified layer 18. Such laser processing is repeated, so that the modified layers 18 are formed along all the streets 14 formed in a first direction.

After the modified layers 18 are formed along all the streets 14 formed in the first direction, the chuck table 35 is rotated by 90°, so that the streets 14 yet to be processed that are extending in the second direction orthogonal to the first direction are positioned along the X axis direction. Then, the focal point Q of the laser beam applying unit 4 is positioned inside the wafer 10 yet to be processed along the street 14, and, while performing processing feed of the chuck table 35 in the X axis direction by operating the X axis feeding mechanism 21, a modified layer 18 is formed inside the wafer 10 along the street 14. After the modified layer 18 is thus formed along the street 14 orthogonal to the first direction, indexing feed in the Y axis direction (indexing feed direction) is performed by operating the Y axis feeding mechanism 22, and application of the laser beam LB corresponding to the adjacent street 14 yet to be processed is conducted to form a modified layer 18. Such processing is repeated, so that the modified layers 18 are formed along all the streets 14 on the wafer 10.

Note that laser processing conditions in the present embodiment may be set, for example, as follows.
Wavelength: 1,342 nm
Repetition frequency: 90 kHz
Average output: 1.2 W
Feed rate: 700 mm/s After the modified layers 18 are formed along all the streets 14 of the wafer 10, the chuck table 35 with the wafer 10 suction held thereon is positioned at the conveying-in/out position illustrated in FIG. 1. Next, the conveying-in/out mechanism 50 is operated to operate the driving mechanism 52, the arm base 53, the arm mechanism 54, the robot hand 55, and the like, so that the wafer 10 held on the chuck table 35 is suction held and is accommodated into a predetermined position in the first cassette 42.

After the above-mentioned reference image storing step is applied to the first wafer 10 and the laser-processed wafer 10 is accommodated in the first cassette 42, the other wafers 10 that are unprocessed and accommodated in the first cassette 42 are sequentially conveyed out, and the laser processing of forming the modified layers 18 in the inside of the wafer 10 is conducted.

In the case of applying the laser processing under the above-mentioned processing conditions to the same kind of wafer 10 after the above-mentioned reference image storing step is conducted, operations of a calculation section 120 and the decision section 130 provided in the control unit 100 are carried out, in place of performing the above-mentioned reference image storing step. The calculation section 120 carries out an agreement degree calculating step in which the reference image G0 that is stored in the reference image storage section 110 and a comparative image G1 of the wafer 10 held by the holding unit 30 that is newly captured by the imaging unit 6 are compared and the degree of agreement is calculated. In addition, the decision section 130 carries out a deciding step in which, in the case where the degree of agreement calculated by the calculation section 120 is above a predetermined value, it is decided that the wafer 10 held by the holding unit 30 is an unprocessed wafer 10 not yet formed with the modified layers 18, and in the case where the degree of agreement is below a predetermined value, it is decided that the wafer 10 held by the holding unit 30 is a processed wafer formed with the modified layers 18.

In the embodiment described below, it is assumed that a reference image G0 of a predetermined wafer 10 is preliminarily captured and stored in the reference image storage section 110, that laser processing of forming the modified layers 18 in all the wafers 10 accommodated in the second cassette 43 has been conducted, and that an instruction to apply the laser processing to the wafers 10 accommodated in the second cassette 43 is erroneously given, and an example in which the operations of the calculation section 120 and the decision section 130 are carried out before the laser processing is applied to the wafer 10 will be described.

As above-described, at the time of applying the laser processing to the wafer 10, the laser processing apparatus 1 according to the present embodiment operates the conveying-in/out mechanism 50 to convey the wafer 10 out of the second cassette 43 and mounts the wafer 10 on the chuck table 35. The wafer 10 mounted on the chuck table 35 is positioned beneath the imaging unit 6.

Figure 5:
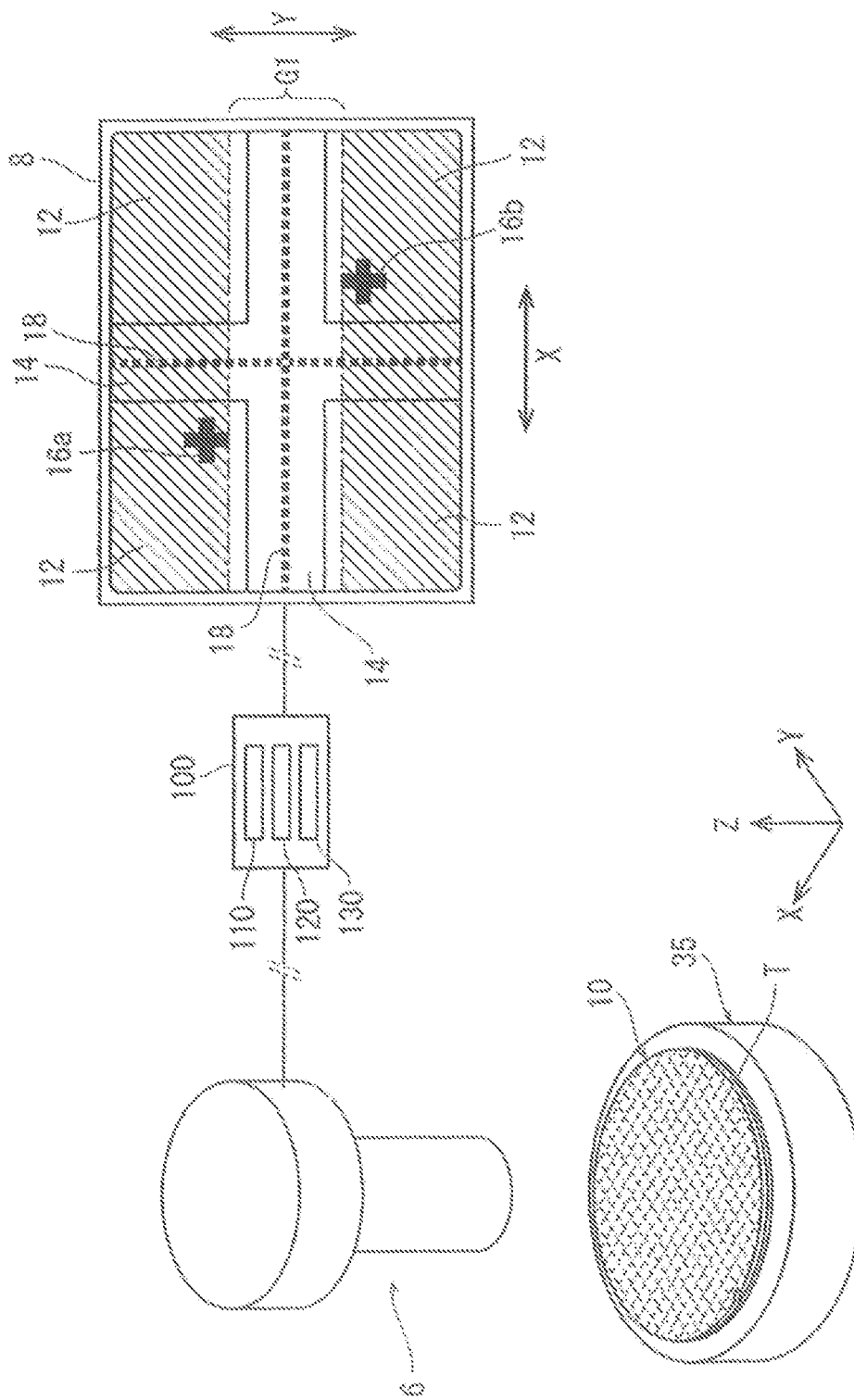
FIG. 5 is a perspective view depicting the manner of imaging the wafer and operating a calculation section and a decision section, in the laser processing apparatus illustrated in FIG. 1.

At the time of positioning the wafer 10 beneath the imaging unit 6, the chuck table 35 is positioned at a position based on the X coordinate and the Y coordinate stored together with the reference image G0 at the time when the reference image storing step has been conducted, and pattern matching is performed, on the basis of the marks 16a and 16b, to select a region to be imaged. Then, as depicted in FIG. 5, a region corresponding to the region when the reference image G0 has been captured is imaged, and the image is displayed on the display unit 8. The image displayed on the display unit 8 captures the modified layers 18 formed inside the wafer 10 along the streets 14, by the operations of the infrared ray applying means and the infrared CCD included in the imaging unit 6, and an image of the region corresponding to the reference image G0 is specified as a comparative image G1. Here, by a control program constituting the calculation section 120, the reference image G0 stored in the reference image storage section 110 and the comparative image G1 captured by the imaging unit 6 are compared, and the degree of agreement of the two images is calculated. As the method of calculating the degree of agreement between the reference image G0 and the comparative image G1, various methods may be adopted. For example, the degree of agreement can be calculated as follows. Note that while the modified layers 18 are represented in the wafer 10 held by the chuck table 35 depicted in FIGS. 4A, 4B, and 5 for convenience of explanation, the modified layers 18 cannot in practice be confirmed by visual inspection.

The reference image G0 and the comparative image G1 are both images captured by use of infrared rays, and, as above-described, they are images represented in light and shade by two colors of black and white. Here, the calculation section 120, in regard of the reference image G0 depicted in FIG. 3 and the comparative image G1 depicted in FIG. 5, sums up numerical values of tones (256 levels) of all the dots constituting each of the images, and calculates tone evaluation values P0 and P1 corresponding to the images. The numerical value of tone is selected such that the blackest tone is set at 0 and as the value increases, the tone gets closer to the whitest tone set at 255. The reference image G0 depicted in FIG. 3 is characterized in that the central street 14 extending in the X axis direction and the street 14 extending in the Y axis direction both appear white since the modified layers 18 are not formed there, so that the numerical value of the tone evaluation value P0 obtained by summing up the tones of all the dots constituting the reference image G0 is high as a whole.

On the other hand, the comparative image G1 depicted in FIG. 5 has the modified layers 18 formed in the centers of the street 14 extending in the X axis direction and the street 14 extending in the Y axis direction, and the modified layers 18 appear black. As a result, the tone evaluation value P1 obtained by summing up the tones of all the dots constituting the comparative image G1 is a lower value than the tone evaluation value P0 of the reference image G0. The calculation section 120 evaluates the extent in which the tone evaluation value P1 of the comparative image G1 agrees with the tone evaluation value P0 of the reference image G0 serving as a reference, and calculates the extent as the degree of agreement. If the wafer 10 for which the comparative image G1 is captured does not include the modified layers 18 formed therein, the tone evaluation value P1 theoretically agrees with the tone evaluation value P0, so that the degree of agreement obtained by the calculation section 120 is calculated as 100%. On the other hand, if the modified layers 18 have already been formed along the streets of the wafer 10 as depicted in FIG. 5, the tone evaluation value P1 is calculated as a low value, so that the degree of agreement is lowered and is calculated as a low numerical value of equal to or less than 80%, for example.

When the degree of agreement between the reference image G0 and the comparative image G1 is calculated by the calculation section 120 as above-mentioned, an operation of the decision section 130 is carried out on the basis of the degree of agreement. In the case where the degree of agreement calculated by the calculation section 120 is above a first predetermined value (for example, 90%), the decision section 130 decides that the wafer held by the holding unit is an unprocessed wafer not formed with the modified layers 18, and in the case where the degree of agreement is below a second predetermined value (for example, 80%), the decision section 130 decides that the wafer held by the holding unit 30 is a processed wafer formed with the modified layers 18.

The wafer 10 accommodated in the second cassette 43 is a processed wafer as above-mentioned, and the degree of agreement in the present embodiment is a value below 80%, so that the decision section 130 decides that the wafer 10 held by the chuck table 35 of the holding unit 30 has already been processed. In that case, if the laser processing is carried out on the wafer 10 as it is, devices 12 may be damaged; therefore, one or more of various alarms is/are issued so as to inform the operator of that laser processing is going to be applied to a processed wafer 10. As the alarm, conventionally known various alarming methods may be adopted, examples of which include issuing an alarm sound (buzzer or the like), displaying an alarm message on the display unit 8, informing by voice from a speaker, informing an error by blinking a red lamp, and a combination of these. In addition, at the time of issuing such an alarm, the operation of the laser processing apparatus 1 is stopped such that the laser processing is not performed.

Note that if the wafer 10 accommodated in the second cassette 43 is an unprocessed wafer, the decision section 130 decides that the wafer 10 held by the holding unit 30 is not yet processed, thereafter an alignment step performed in normal laser processing is performed on the wafer 10 as it is, and the above-mentioned laser processing is carried out.

In the decision section 130 in the present embodiment, the decision based on the degree of agreement calculated by the calculation section 120 is conducted using 90% as the first predetermined value and 80% as the second predetermined value. By using these two different predetermined values, it is possible, in addition to the decision of whether the wafer is unprocessed or processed, to decide that defective processing may have been generated. More specifically, for example, in the case where the degree of agreement calculated by the calculation section 120 is 85%, the degree of agreement is not above the first predetermined value (90%) and is not below the second predetermined value (80%), so that it is presumed that laser processing has been conducted so as to form the modified layers 18 but the formation of the modified layers 18 is not adequate, and it is decided that defective processing has been highly possibly generated. In that case, therefore, an alarm signal indicative of that defective processing has occurred is issued to the operator. As aforementioned, examples of the means for issuing the alarm signal include issuing an alarm sound (buzzer or the like), displaying an alarm message on the display unit 8, informing by voice from a speaker, informing an error by blinking a red lamp, and a combination of these.

Note that in the present invention, in regard of the predetermined values used at the time of deciding in the decision section 130, the first predetermined value and the second predetermined value may not necessarily be different values. In the case where it is unnecessary to detect defective processing, for example, the first predetermined value and the second predetermined value may be the same value (for example, 90%). In such a case, when the degree of agreement is above 90%, it may be decided that the wafer 10 held by the holding unit 30 is not yet processed, and when the degree of agreement is equal to or less than 90%, it may be decided that the wafer 10 held by the holding unit 30 has been processed.

Thus, by use of the calculation section 120 and the decision section 130, it is possible to decide whether the wafer 10 imaged by the imaging unit 6 has not yet been processed or has been processed. Therefore, processing of a processed wafer 10 again by the laser processing apparatus can be prevented, so that a problem that irregular reflection of the laser beam on the previously formed modified layers occurs to damage devices can be solved.

In the above-described embodiment, the region for identifying the reference image G0 and the comparative image G1 has been specified by limiting the region imaged by the imaging unit 6, but this is not limitative. Operations of the reference image storage section 110, the calculation section 120, and the decision section 130 may be performed by use of the whole part of the image captured by the imaging unit 6. It is to be noted, however, that when the region used for decision is limited to the narrow region including the streets 14, it is thereby possible to enhance the accuracy in determining whether the wafer in question has not yet been processed or has been processed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus for subjecting a wafer to laser processing, the wafer being formed on a front surface thereof with a plurality of devices in a state of being partitioned by a plurality of intersecting streets, the laser processing apparatus comprising:
    a chuck table that holds the wafer;
    a laser beam applying unit that applies a laser beam of such a wavelength as to be transmitted through the wafer to the wafer held by the chuck table, with a focal point of the laser beam positioned inside the wafer along the streets, to form modified layers inside the wafer to be start points of division;
    a feeding mechanism that performs relative processing feed of the chuck table and the laser beam applying unit;
    an imaging unit that images the wafer in a manner of transmission of infrared rays through the wafer; and
    a control unit,
    wherein the control unit includes:
        a reference image storage section that images the streets before formation of the modified layers by the imaging unit and stores an obtained image as a reference image,
        a calculation section that compares the reference image stored in the reference image storage section with an image of the wafer held by the chuck table, the image being captured by the imaging unit, and calculates a degree of agreement of the two images, and
        a decision section that decides that the wafer held by the chuck table is an unprocessed wafer not formed with the modified layers in a case where the degree of agreement calculated by the calculation section is more than a first predetermined value, and decides that the wafer held by the chuck table is a processed wafer formed with the modified layers in a case where the degree of agreement is equal to or less than a second predetermined value.

2. The laser processing apparatus according to claim 1, wherein the control unit issues an alarm signal in a case where the decision section decides that the wafer held by the chuck table has been processed, before the laser processing of forming the wafer with the modified layers by the laser beam applying unit is carried out.

3. The laser processing apparatus according to claim 1, wherein the first predetermined value is set to be higher than the second predetermined value, and the control unit issues an alarm signal indicating that defective processing has been generated in a case where the decision section decides that the degree of agreement calculated by the calculation section is not above the first predetermined value and is not below the second predetermined value.

4. The laser processing apparatus according to claim 1, wherein the first predetermined value and the second predetermined value are the same value.

* * * * *